United States Patent [19]

Oyamada

[11] Patent Number: 4,812,950
[45] Date of Patent: Mar. 14, 1989

[54] MEANS FOR MOUNTING A ROM ON A PRINTED CIRCUIT BOARD

[75] Inventor: Takashi Oyamada, Tokyo, Japan

[73] Assignee: NEC Corporation, Japan

[21] Appl. No.: 50,058

[22] Filed: May 14, 1987

[30] Foreign Application Priority Data

May 16, 1986 [JP] Japan .............................. 61-73711[U]

[51] Int. Cl.⁴ .............................................. H05K 5/02
[52] U.S. Cl. .................................... 361/395; 361/399; 361/417
[58] Field of Search ............... 361/380, 394, 395, 399, 361/401, 403, 413, 417–419, 420; 439/65, 68, 70, 72, 76

[56] References Cited

U.S. PATENT DOCUMENTS 2,977,562 3/1961 Benson .................................. 439/65
3,366,914 1/1968 McManus et al. ................... 439/72

Primary Examiner—Philip H. Leung
Assistant Examiner—Gregory D. Thompson
Attorney, Agent, or Firm—Laff, Whitesel, Conte & Saret

[57] ABSTRACT

A structure for mounting a read only memory (ROM) on a main carrier member (such as a printed circuit board) is installed in an open-top casing of a paging receiver, for example. A ROM mounting member is positioned inside the casing and on the interior side of the main carrier member. This arrangement allows a ROM to be installed and replaced at the open end side of the casing and within a recess which is formed through the main carrier member.

8 Claims, 3 Drawing Sheets

MEANS FOR MOUNTING A ROM ON A PRINTED CIRCUIT BOARD

BACKGROUND OF THE INVENTION

The present invention relates to a structure for mounting a read only memory (ROM) on a main carrier member which is installed in a paging receiver, for example. More particularly, it relates to an improvement in the structure of a structure for mounting a ROM on a printed circuit board.

A ROM structure; of the kind described herein generally includes an open-top box-like casing. A main carrier member (such as a printer circuit board) is installed in the casing. A ROM structural member is provided on the that surface of the main carrier member which faces the interior of the casing. A cover member is provided for closing the open top of the casing. A problem with such a prior art ROM structure is that when one desires to remove a ROM to inspect it, to rewrite its contents and for other purposes, he or she has to remove the main carrier member from the casing. Then the ROM which is disposed within the casing is removed, resulting in many troublesome manipulations. Moreover, a main carrier member built in a paging receiver and the like is usually loaded not only with a ROM but also with other various kinds of electrical parts in a dense configuration. In such a condition, a force may be carelessly applied to the carrier member during a removal of the carrier member from the casing. That force might bend the carrier member to cause the electrical parts to interfere with each other and perhaps damage other precision parts. For these reasons, there has been a keenly demanded ROM structure which allows a ROM to be removed without the need for removing a main carrier member.

SUMMARY OF THE INVENTION

It is therefore an object of the present invention to provide a ROM structure which allows a ROM to be installed and removed, for example, in a paging receiver, without resorting to the removal of a main carrier member.

It is another object of the present invention to provide a ROM structure for a paging receiver which protects various electrical parts mounted on a main carrier member against damage during the attachment and detachment of a ROM.

It is another object of the present invention to provide a generally improved ROM structure for a paging receiver and other devices.

A structure for mounting a ROM according to the present invention, comprises a box-like casing which is open at one end thereof. A flat main carrier member is partly machined to have a recess and is mounted on to the A circuit pattern is printed on the surface of the main carrier member, which faces the one end of the casing and a part loaded surface of the main carrier member. Various electrical parts are mounted on the printed circuit board which faces inwardly within the casing. A ROM structure member is fitted on the part loading surface of the main carrier member is in alignment with the recess for mounting the ROM, which is inserted in the casing from an open end side of the casing, to make a connection between the ROM and the circuit pattern.

In accordance with the present invention, a structure for mounting a read only memory (ROM) on a main carrier member is installed in a open-top casing of a paging receiver and other similar devices. A ROM structure member is positioned on the inside of the main carrier member inside the casing to enable a ROM to be put in and out at the open end side of the casing through a recess which is formed through the main carrier member.

The above and other objects, features and advantages of the present invention will become more apparent from the following detailed description taken with the accompanying drawings.

DESCRIPTION OF THE PREFERRED EMBODIMENT

Figure 1:
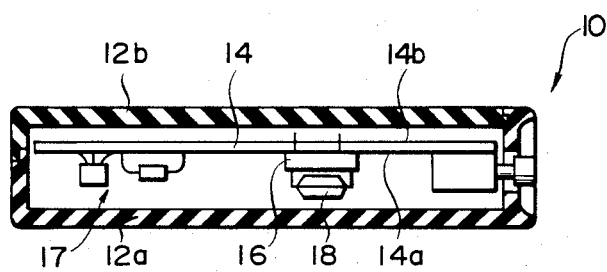
FIG. 1 is a vertical section showing a prior art ROM structure.

To better understand the present invention, a brief reference will be made to a prior art ROM structure (FIG. 1) for a paging receiver and other similar devices. The prior art ROM structure, generally 10, includes a casing 12a in which a main carrier member 14 is installed. A ROM structural member 16 is soldered to a parts 17 loading surface 14a of the main carrier member 14. A ROM 18 is mounted on the carrier member 14 through, the ROM structural member 16. Specifically, the ROM structural member 16 is fitted on the part loading surface 14a of the main carrier member 14 at one side thereof and is provided, at the other side, with openings for receiving socket contacts which are adapted for making electrical contact with the ROM 18. The part loading surface 14a of the main carrier member 14 which is loaded with the ROM 18 as stated above is located to face inwardly into the casing 12a. The other surface 14b of main carrier member 14, opposite to the part loading surface 14a, is provided with a circuit pattern thereon. A cover member 12b is provided for closing the open end of the box-like casing 12a which is adjacent to the circuit pattern surface 14b of the main carrier member 14.

As stated above, in the prior art ROM structure 10, the ROM 18 is mounted on the main carrier member 14 in such a manner as to face inwardly into the casing 12a. This is disadvantageous in that the removal of the ROM 18 has to be implemented with a delicate and troublesome manipulation and may even damage the other electrical parts which share the main carrier member 14 with the ROM 18.

Figure 2:
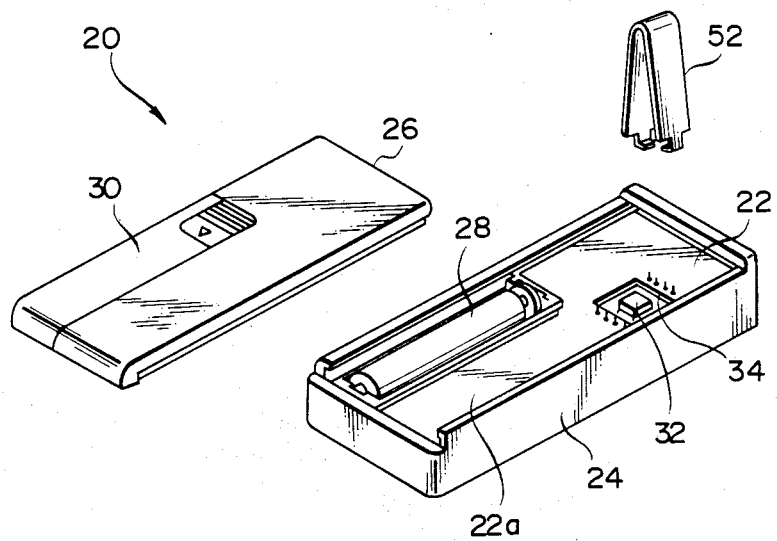
FIG. 2 is an exploded perspective view of a ROM structure embodying the present invention and a ROM loaded in the ROM structure.

Referring to FIGS. 2 to 5, an inventive ROM structure for a paging receiver and other similar devices embodying the present invention is shown and generally designated by the reference numeral 20. As shown in FIG. 2, the ROM structural 20 generally comprises a box-like casing 24 which is open at one end thereof, a flat main carrier member 22 is received in the casing 24. A cover member 26 closes the open end of the casing 24. The main carrier member 22 has a circuit pattern surface 22a which is printed with a predetermined circuit pattern. A battery 28 is installed in the casing 24 to power the circuit provided on the circuit pattern surface 22a. Mounted on the other surface of the main carrier member 22 are various electrical parts, not shown, which are interconnected by a circuit pattern. Specifically, while that surface of the main carrier member 22 which is loaded with the various electrical parts faces inwardly into the casing 24, the circuit pattern surface 22a faces the outside of the casing, i.e. the cover member 26. In FIG. 2, the reference numeral 30 designates a battery cover member.

Figure 3:
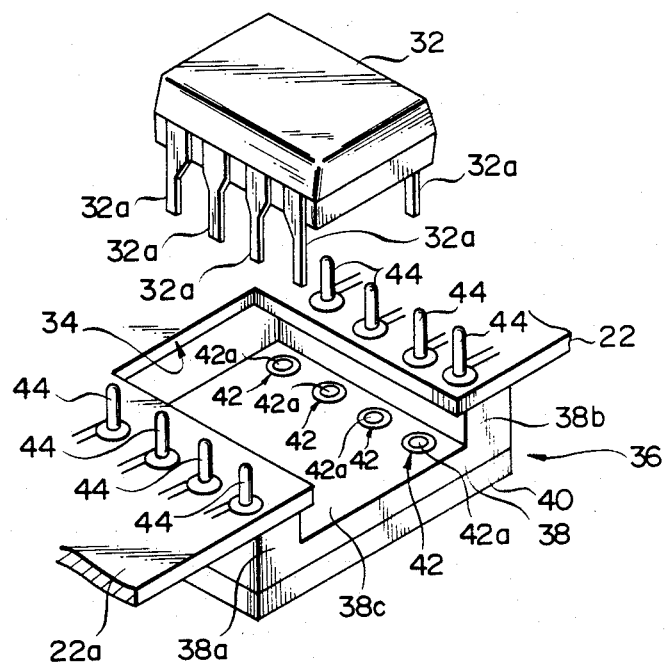
FIG. 3 is an enlarged perspective view of a portion of the ROM structure of FIG. 2 which is adapted to receive the ROM.

As shown in an enlarged scale in FIG. 3, the main carrier member 22 is notched to have a recess 34 for receiving a ROM 32. A ROM structural member 36 is fixed to the main carrier member 22 in alignment with the recess 34. The ROM structural member 36 is made up of a frame 38 and a circuit board 40 which underlies the frame 38, as viewed in FIG. 3. The frame 38 has a generally U-shaped section, i.e., it includes projections 38a and 38b which are provided at opposite edges of the frame 38, and a flat surface 38c defined between the projections 38a and 38b. The flat surface 38c is provided with socket contacts 42 each having an opening 42a for receiving a respective one of leads 32a of the ROM 32. On the other hand, each of the projections 38a and 38b is provided with a row of pins 44 adapted for connection with the circuit which is printed on the circuit pattern surface 22a of the main carrier member 22. The socket contacts 42 and the pins 44 are paired and electrically interconnected on a one-to-one basis.

Figure 4:
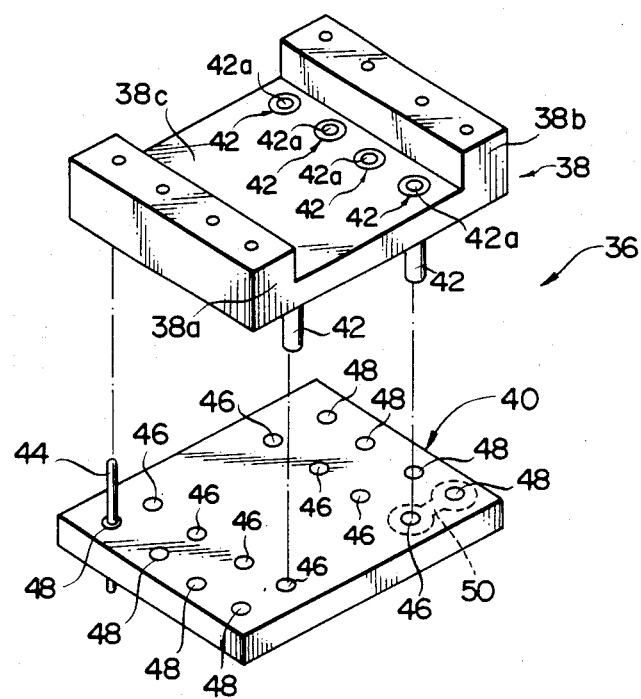
FIG. 4 is an exploded perspective view showing in an enlarged scale a ROM structure member which is included in the ROM structure of FIG. 2.
Figure 5:
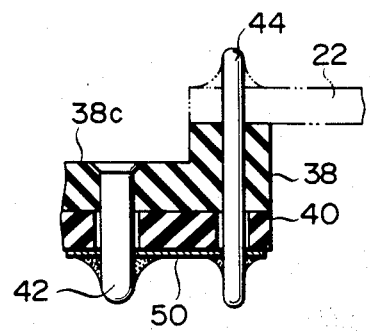
FIG. 5 is a fragmentary sectional view showing electrical connection between the ROM structural member of FIG. 4 and a main carrier member.

As shown in FIG. 4, the circuit board 40 which forms a part of the ROM structural member 36 is provided with through openings 46 for receiving the socket contacts 42, and through openings 48 for receiving the pins 44. A conductive pattern 50 is provided on the circuit board 40 to surround those openings 46 and 48 which are assigned to a respective one of the socket contact and pin pairs (only one is shown in the drawing). The socket contacts 42 are individually press-fitted in through openings of the frame 38, then inserted in the openings 46 of the circuit board 40, and then fixed in place by soldering. Likewise, the pins 44 are individually soldered in the openings 48 of the circuit board 40. Each soldering is effected on the conductive patterns 50, whereby the socket contacts 42 and their associated pins 44 are electrically connected to each other (see FIG. 5). As shown in FIG. 3, the tip of each pin 44 projects from the circuit pattern surface 22a of the main carrier member 22, i.e., at the flat surface 38c side of the frame 38 where the openings 42a of the socket contacts 42 are open.

As shown and described, the ROM structural member 36 is fixed to the main carrier member 22 by soldering the pins 44 on the part mounting side of the member 22 (see FIG. 3). The leads 32a of the ROM 32 are individually inserted in the socket contacts 42 from the circuit pattern surface 22a side of the main carrier member 22.

The dimension of the projections 38a and 38b provided on the ROM structural member 36 is determined in consideration of the height, or thickness, of the ROM 32. Specifically, the dimension is such that the mounted ROM 32 does not protrude too far from the circuit pattern surface 22a of the main carrier member 22 to attach the cover member 26 to the casing 24. When the height of the ROM 32 is relatively low, it may sometimes be needless for both edges of the ROM structural member 36 project as shown and described.

In the ROM structural 20 having the above construction, the ROM 32 is installed and removed from the circuit pattern surface 22a side of the main carrier member 22, i.e., from the cover member 26 side. This allows one to remove the ROM 32 for inspection, rewriting and other purposes without removing the main carrier member 22 from the casing 24, thereby promoting an easy manipulation and protecting the parts on the member 22 against damage. For the removal of the ROM 32, a tool 52 having a suitable configuration, FIG. 2, is used. It is noteworthy that the ROM structural member 36 can be handled in the same manner as the prior art mounting 16 except for the circuit board 40 and pins 44, realizing extensive application of the structure 20.

In summary, it will be seen that a ROM structure in accordance with the present invention allows a ROM to be installed and removed easily and without removing a main carrier member from a casing, enhancing easy manipulation and eliminating damage to various electrical parts on the main carrier member.

Various modifications will become possible for those skilled in the art after receiving the teachings of the present disclosure without departing from the scope thereof.

What is claimed is:

1. A mount for mounting a ROM which may have to be changed from time-to-time, said mount comprising:
   a box-like casing having an open side which is closed by a cover member;
   a carrier member having a printed circuit on one surface and an aperture extending from said one surface to the opposite surface, said carrier member being mounted on said casing with said printed circuit facing the outside of said casing and said aperture facing the cover so that electronic parts mounted on said carrier member and interconnected by said printed circuit are inside said casing; and
   ROM mounting means mounting on said carrier member in the area of said aperture for receiving a ROM through said aperture, said ROM mounting means having electrical connecting means which electrically connects leads of a ROM to said printed circuit on said one surface, whereby a ROM may be changed from the side of said cover.

2. A mount as claimed in claim 1, wherein the ROM mounting means comprises a support member for supporting a ROM, and a connecting member for connecting a ROM supported by said support member to the printed circuit.

3. A mount for mounting a ROM which may have to be changed from time-to-time, said mount comprising:
   a box-like casing having an open side which is closed by a cover member;
   a carrier member having a printed circuit on one surface and an aperture extending from one surface to the opposite surface, said carrier member being mounted on said casing with said printed circuit facing the exterior of said casing and said aperture facing the cover, whereby electronic parts mounted on said carrier member and interconnected by said printed circuit are inside said casing and a ROM mounted in said recess confronts the outside of said casing;

ROM mounting means mounted on said carrier member in the area of said recess for receiving a ROM installed in said recess and on said opposite surface, said ROM mounting means having terminals which are connected to said printed circuit on said one surface;

said ROM mounting means comprising a support member for supporting a ROM, a connecting member for connecting a ROM supported by said support member to the printed circuit; and said support member comprising a frame, and said connecting member comprising a flat circuit board which is connected to said frame at an interior side of the casing.

4. A mount as claimed in claim 3, wherein a ROM has leads for connecting it into an electrical circuit, the support member further comprises electrical connecting means, said electrical connecting means positioned to fit within socket contact openings formed through the frame, said electrical connecting means being adapted to receive a respective lead of a ROM, pin openings formed through said frame and confronting openings formed in said flat circuit board, and pins inserted into a respective one of said openings in said frame making a connection to the printed circuit.

5. A mount as claimed in claim 4, wherein the electrical connecting means further fit within second contact openings formed within said flat circuit board, said pin openings being formed through said flat circuit board, each of said confronting pin openings receiving a respective one of the pins, and conductive patterns formed on said flat circuit board and connecting a respective one of said electrical connecting means with a paired pin.

6. A mount as claimed in claim 3, wherein the frame has a substantially flat configuration.

7. A mount as claimed in claim 3, wherein the frame comprises projections which are provided at both edges of said frame, and a flat surface defined between said projections.

8. A mount as claimed in claim 7, wherein height of said projections of the frame is determined in conformity to that of a ROM.

* * * * *